United States Patent [19]
Colligan

[11] 3,961,260
[45] June 1, 1976

[54] APPARATUS AND METHOD FOR TESTING THE CONDITION OF AN ANTENNA MONITORING SYSTEM

[76] Inventor: Francis S. Colligan, 5200 Oakland Road, Chevy Chase, Md. 20015

[22] Filed: June 5, 1973

[21] Appl. No.: 367,340

[52] U.S. Cl................ 325/133; 325/363; 343/703
[51] Int. Cl.².......................... H04B 17/00
[58] Field of Search ............ 325/67, 133, 160, 363; 324/57 R, 58 A, 62 R; 343/703, 750, 850, 852, 853, 860, 861; 340/253 H, 224, 177 CA, 177 VZ, 177 VA; 330/2

[56] References Cited
UNITED STATES PATENTS

| | | | |
|---|---|---|---|
| 2,196,590 | 4/1940 | Koch | 343/703 |
| 2,995,704 | 8/1961 | Norgaard | 324/62 R |
| 3,130,368 | 4/1964 | Hoover | 325/67 |
| 3,182,262 | 5/1965 | Schumann | 325/67 |
| 3,296,533 | 1/1967 | Karpinsky | 325/67 |
| 3,427,614 | 2/1969 | Vinding | 325/67 |
| 3,548,310 | 12/1970 | Fenwick | 325/67 |
| 3,718,931 | 2/1973 | Collins | 343/703 |

Primary Examiner—Robert L. Griffin
Assistant Examiner—Jin F. Ng
Attorney, Agent, or Firm—Donald A. Kettlestrings

[57] ABSTRACT

A method and apparatus for testing the condition of an antenna monitoring system are provided whereby a sampling loop and coaxial cable assembly may be provided for each antenna element and wherein each such assembly is normally terminated with a first impedance. The magnitude of current flowing through the normally terminated assembly or monitoring system is measured at a time when the antenna system and the monitoring system are known to be operating in a desired condition. An additional impedance is then placed in circuit with the first impedance and the new magnitude or offset value of current flowing through the assembly is measured. If the ratio or the difference between the normally terminated value of current and the offset value of current changes from the originally established base value, there is a strong liklihood that there is an abnormality in the sampling loop and cable assembly and probably not in the antenna system itself. Thus, a premature conclusion that the abnormality is in the antenna system is avoided when, in fact, the abnormality is in the monitoring system.

16 Claims, 2 Drawing Figures

U.S. Patent June 1, 1976 3,961,260
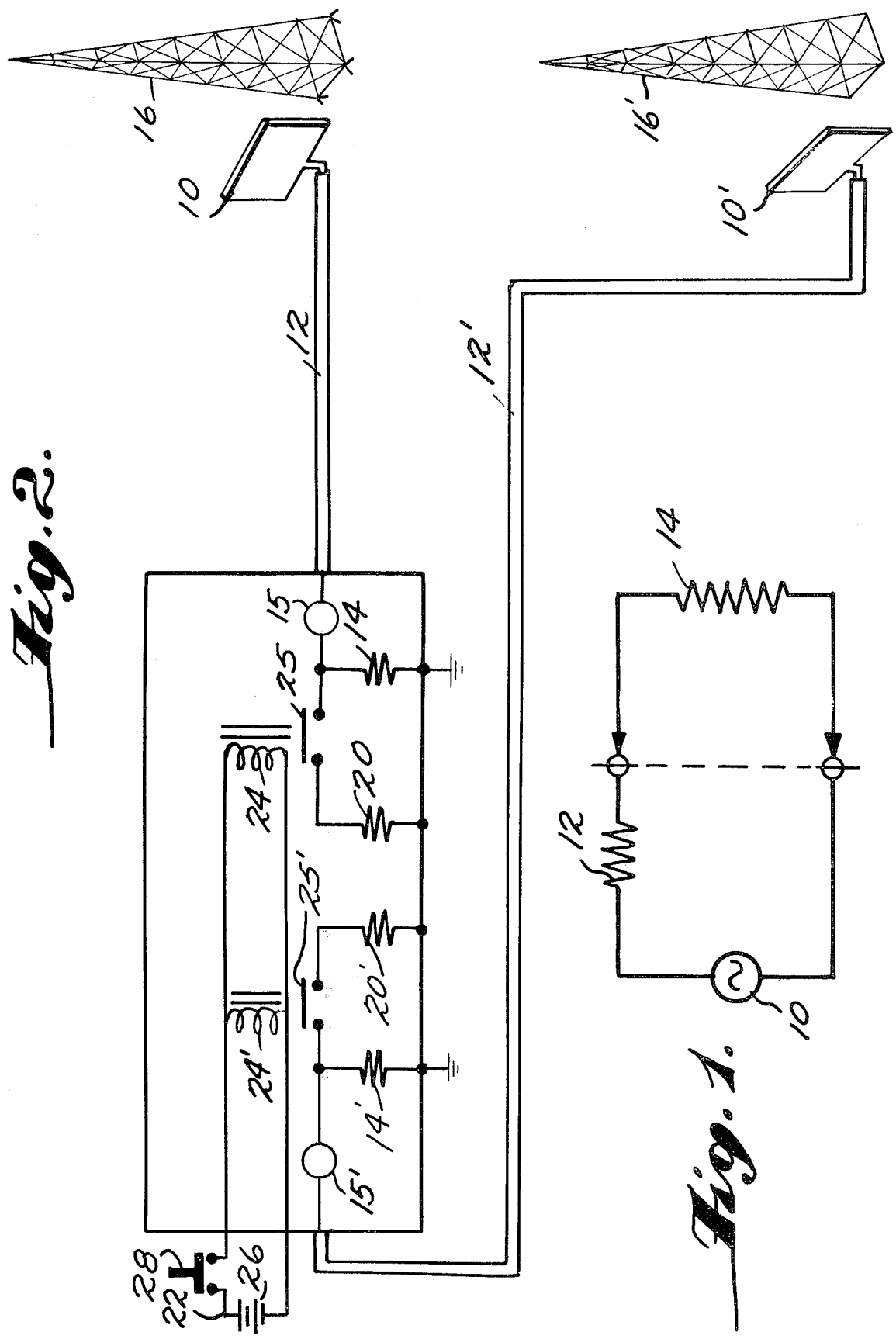

APPARATUS AND METHOD FOR TESTING THE CONDITION OF AN ANTENNA MONITORING SYSTEM

This invention relates to antenna monitoring systems and more particularly to a method and apparatus for testing the condition of a monitoring system utilized to monitor the operating characteristics of directional antennas.

Standard broadcast directional antennas, as an example, are linear phased array radiation systems that employ vertical tower elements, each of which is fed in an exacting program of current magnitudes and phase angles in order to establish a desired shape of directional radiation pattern. Tight tolerances must generally be held to in order to preserve the shape of the radiation pattern. Such tolerances are on the order of a percent or so of current ratio and a degree or so in phase angle.

The traditional system of monitoring the status of a directional antenna consists of a phase measuring instrument combined with a current ratio indicator. Each antenna tower is fitted with any one of a number of forms of inductively coupled sampling loops mounted close to the tower so as to pick up a sample of the R.F. energy flowing in the tower. A coaxial cable connected to the loop carries this sample to the transmitter building where it feeds the antenna monitor, which in turn, displays the current magnitude ratio and phase relationship between any two towers selected at a given time for observation. Consulting engineers employ the antenna monitoring system to make adjustments to such directional antenna arrays when the occasional need arises, and station operators log the monitor readings periodically as required by Federal Communications Commission rules.

Antenna phase and current ratio monitors have reached a very high state of reliability and stability so that operators seldom have to make adjustments to such monitors before taking readings. Unfortunately, sampling cables and sampling loops have not kept pace with the state of the art of the monitors which they feed. Despite the fact that the high power branching, phase shifting and impedance matching circuits that feed energy to the antenna towers themselves have traditionally been built with extremely rugged mechanical structures and with highly overrated electrical components, all for the sake of array stability, sampling cables and sampling loops have always left a great deal to be desired in terms of long-term stability and repeatibility.

Because of this instability, it is advisable when installing an antenna monitoring system to make impedance measurements on the cable and loop sampling assembly for each antenna tower so that if future monitor readings change, it can be readily ascertained whether the problem lies in the antenna array itself or in the relatively unstable and unreliable impedance of the sampling assembly. New rules are presently being considered by the F.C.C. which would require that a proof of performance submitted to the F.C.C. include impedance measurements and/or propagation time measurements as reference data for future periodic tests on a sampling assembly to determine if its characteristics have remained stable over a period of time.

Even with this proposed F.C.C. rule, two problems remain. First, is the problem of the requirement for a skilled consulting engineer to make the measurements on the sampling line and loop system. His typical bridge measurements require that broadcasting be interrupted and that the broadcast station be off the air so that measurements may be made with no signal on the line that would interfere with such measurements. Second, is the problem that such measurements are far from the normal routine of a typical station operator. The operator's primary duty is to make only minor adjustments to the transmitter and audio equipment as occasionally required, and otherwise to watch over and record monitoring instrument readings.

It is, therefore, an object of the present invention to provide a method and apparatus for testing the condition of the sampling cable and sampling loop assembly utilized to monitor a particular antenna tower whereby the testing can be conducted by a typical station operator while the broadcast station remains on the air.

Another object is to provide such a method and apparatus whereby the operator can make antenna monitoring system observations merely by determining a first set of current magnitude readings and then by pushing a button on the monitor to take a second set of current magnitude readings.

Yet another object of the present invention is the provision of such a method and apparatus which enable the broadcast station to remain on the air.

Additional objects and advantages of the invention will be set forth in part in the description which follows, and in part will be obvious from the description, or may be learned by practice of the invention. The objects and advantages are realized and attained by means of the instrumentalities and combinations particularly pointed out in the appended claims.

To achieve these and other objects, the present invention provides an antenna monitoring system having at least one sampling element coupled to an antenna element, an antenna monitor having at least a first impedance, and at least one electrical energy conductor connected between the sampling element and the impedance, the improvement comprising at least one additional impedance adapted to be selectively placed in circuit relationship with the first impedance, and circuit means in operative relationship with the additional impedance for selectively placing the additional impedance in circuit with the first impedance and for enabling changes in the monitoring system to be determined.

The invention further provides an on-the-air method for determining the condition of an antenna monitoring system comprising the steps of receiving radiated energy from an antenna element by means of a sampling element, conducting the energy through a termination impedance, determining the magnitude of current passing through the termination impedance, connecting an additional impedance in circuit relationship with respect to the termination impedance, determining the magnitude of current passing through the termination impedance and through the additional impedance, determining the difference between the magnitudes of currents measured before and after the additional impedance is connected in circuit, and monitoring the difference in the magnitudes of currents to detect a change in the difference whereby the condition of the antenna monitoring system can be maintained as desired and whereby changes in desired characteristics of the antenna element can be accurately determined.

It is to be understood that both the foregoing general description and the following detailed description are exemplary and explanatory but are not restrictive of the invention.

The accompanying drawings, which are incorporated in and constitute a part of this specification, illustrate an example of a preferred embodiment of the invention and, together with the description, serve to explain the principles of the invention.

FIG. 1 shows a theoretical circuit used to explain the operation of the invention; and FIG. 2 is a schematic illustration of the apparatus of this invention.

It is well known that the internal impedance of a generator is simply its open circuit voltage divided by its short circuit current. On many generators such a test would be disastrous, but, in the case of a broadcast tower sample loop and associated cable assembly, acting as a generator, such a test would be harmless and easy for the operator to readily perform. From this basic theory it follows that if two voltage or current values are measured with respect to two values of cable terminating impedance, the internal impedance of the effective generator formed by the sampling loop and cable may be readily determined, either absolutely or relatively. This internal impedance of the effective generator can then be compared with reference data indicative of the impedance of the effective generator at a time when the loop and cable system was known to be in good condition. This procedure, of course, may be accomplished by inserting a stable impedance in series or in shunting relationship with the normal termination impedance. But, the shunting technique is presently preferred for mechanical reasons and because of the greater ease with which such a system may be incorporated into existing phase and current ratio instruments systems.

With reference now to the drawings, FIG. 1 illustrates the theoretical circuit upon which the method and apparatus of this invention are based. In this simplified circuit, sampling loop 10 and cable 12 act together as an equivalent generator circuit, and termination resistance 14 is located within the antenna monitor. The circuitry of this invention is illustrated in more detail in FIG. 2 wherein sampling loops or elements 10, 10' are positioned adjacent to antenna elements or towers 16, 16'. Sampling loops 10, 10' are shown inductively coupled to antenna elements 16, 16' and the loops are also connected via electrical energy conductors 12, 12', e.g. coaxial cables, to first termination impedances 14, 14' respectively. Only two towers 16, 16' and associated circuitry of this invention are illustrated, but it should be understood that corresponding circuitry of the invention could be provided for a larger number of towers.

Additional impedances 20, 20' are adapted to be placed in circuit relationship with first impedances 14, 14', and circuit means 22 are in operative relationship with additional impedances 20, 20' for selectively placing the additional impedances in circuit with first impedances 14, 14'. Impedances 14, 14', 20 and 20' are preferably resistors of known resistances.

In addition, circuit means 22 include relays 24, 24' having contacts 25, 25' positioned with respect to resistors 14, 20 and with respect to resistors 14', 20', respectively, for placing resistances 14 and 14' in shunt relationship with respect to resistors 20 and 20'. A source of electrical energy 26 and a control contact 28 are in circuit with coils of relays 24, 24', which are energized by source 26 when contact or pushbutton 28 is depressed.

In operation of the method and apparatus of this invention, radiated energy from tower 16, for example, is received by sampling element 10. Element 10 is preferably a sampling loop inductively coupled to antenna 16. The R. F. energy is then conducted through coaxial cable or waveguide 12 to termination impedance 14. The voltage across impedance 14, and thus the current passing therethrough, is determined by means of a voltmeter, not shown. An ammeter 15 could also be used to measure the current passing through inpedance 14. This procedure is initially followed when the antenna and the loop-cable assembly are known to be operating correctly.

An additional impedance 20 is then placed in shunt relationship with respect to impedance 14 by means of contact 25 of relay 24 as a result of pushbutton 28 being depressed by the operator. The reduced current passing through combined impedance 14, 20 is then determined by means of the ammeter 15 or a voltmeter, and the difference between the magnitudes of currents measured before and after additional impedance 20 is connected in circuit is determined. This difference in the currents then becomes a reference which can be used to compare later current measurements.

The same procedure can be followed with respect to sampling loop 10' and cable 12' and with respect to corresponding loop-cable assemblies for other antenna elements (not shown) in order to establish a reference reading for each loop-cable assembly. These procedures are conducted initially when the antenna system is known to be in the proper operating condition and when the monitoring system and loop-cable assemblies are also known to be in proper condition.

Unfortunately, sampling cables and sampling loops are seldom designed for long-term stability. As a result, the passage of time and repeated use of the sampling cables and loops will often cause them to alter their impedances. This results in inaccurate indications by the antenna monitor and makes it impossible to accurately determine when the antenna elements are operating properly or improperly. Frequently, indications by the monitor that the antennas are not functioning correctly are the result of changed impedance in the sampling assemblies themselves when, in fact, the antennas are performing properly.

By use of the method and apparatus of this invention the operator, after measuring the current passing through impedance 14, for example, merely depresses pushbutton 28 on the antenna monitor and takes a new current reading to determine the magnitude of current passing through impedance combination 14, 20. By depressing pushbutton 28, relays 24 and 24' are energized and relay contacts 25, 25' are moved so as to place impedances 20, 20' in shunt with respect to impedances 14, 14', respectively. The system may, of course, be designed so that pushbutton 28 activates any number of relays corresponding to any number of antenna elements and their associated sampling systems.

By shunting impedance 20 across impedance 14, for example, the magnitude of current passing through cable 12 decreases. With this new current magnitude, along with the magnitude of normal current passing through impedance 14 alone, computations can be made to arrive at a number that is a linear first order function of the sampling loop and cable assembly internal impedance.

As previously explained, the difference between the current magnitude passing through impedance 14 alone and the current passing through combined impedances 14, 20 is determined for the situation where antenna element 16 is operating in the normal or desired condition and where sampling loop 10 and cable 12 are operating at desired impedances. Shunting fixed impedance 20 across impedance 14, as described above, causes a downward shift in the indication of current magnitude under the desired conditions. This difference in current magnitudes measured under the desired conditions of the antenna and of the loop-cable assembly becomes the reference or base. Accordingly, any time the ratio or the difference between these current magnitudes changes from the originally established reference or base value, there is most likely a flaw or a changed impedance in the sampling system (loop-cable assembly) and not in the antenna system itself. Thus, an important advantage of the method and apparatus of this invention is that they prevent premature conclusions that something is wrong with the antenna array itself when the abnormality is actually occurring in the sampling assembly.

The method and apparatus of this invention, therefore, enable an operator to make and log impedance observations of the sampling assemblies merely by pushing a button on the antenna monitor. The resulting data can later be given to a consulting engineer for detailed analysis of the condition of the sampling cable and sampling loop. Any variations from the reference values can be promptly detected and acted upon by the station operator. Secondly, the method and apparatus of this invention provide the advantage that the broadcast station does not have to go off the air during testing since the method inherently requires that the station be on the air for the purpose of testing. In short, this new method is dynamic rather than passive in nature and enables the broadcast station to remain on the air during testing without interruption of programming.

The invention in its broader aspects is not limited to the specific details shown and described, and departures may be made from such details without departing from the principles of the invention and without sacrificing its chief advantages.

What is claimed is:

1. In an antenna monitoring system having at least one sampling element coupled to an antenna element, an antenna monitor having at least a first impedance and at least one electrical energy conductor connected between the sampling element and the impedance, the improvement comprising:
   at least one additional passive impedance located for selective placement in circuit relationship with said first impedance; and
   circuit means in operative relationship with said additional impedance for selectively placing said additional impedance in circuit with said first impedance and for enabling changes in said monitoring system to be determined by comparing the currents passing through said first and said additional impedances when the antenna element and the monitoring system are known to be operating properly with the currents passing through said first and said additional impedances when the antenna element and the monitoring system are now known to be in proper operating condition.

2. A system as in claim 1 wherein said additional impedance is located for placement in shunt relationship with respect to said first impedance.

3. A system as in claim 1 wherein said first impedance and said additional impedance are resistors.

4. A system as in claim 1 wherein said circuit means include contact means in operative relationship with said first impedance and with said additional impedance for placing said additional impedance in shunt relationship with respect to said first impedance.

5. A system as in claim 1 wherein said circuit means include:
   at least one relay having a contact in operative relationship with said first impedance and with said additional impedance for placing said additional impedance in shunt relationship with respect to said first impedance when said relay is energized;
   a source of electrical energy; and
   a control contact in circuit relationship with said relay and with said energy source for selectively completing an electrical circuit between said energy source and said relay, whereby said additional impedance is placed in shunt relationship with said first impedance by means of said relay contact.

6. A system as in claim 1 wherein said sampling element is a sampling loop inductively coupled to said antenna element.

7. A system for monitoring a plurality of antenna elements, comprising:
   a plurality of sampling elements coupled to said plurality of antenna elements;
   an antenna monitor having a first plurality of passive impedances;
   a plurality of electrical energy conductors connected between said sampling elements and said first impedances;
   a second plurality of passive impedances located for placement in circuit relationship with said first impedances; and
   circuit means in operative relationship with said second impedances for selectively placing said second impedances in circuit with said first impedances and for enabling changes in said monitoring system to be determined.

8. A system as in claim 7 wherein said sampling elements are inductively coupled to said antenna elements.

9. A system as in claim 8 wherein said first and second plurality of impedances are resistances.

10. An on-the-air method for determining the condition of an antenna monitoring system, comprising the steps of:
    receiving radiated energy from an antenna element by means of a sampling element;
    conducting said energy through a first passive termination impedance;
    determining the magnitude of current passing through said termination impedance;
    connecting an additional passive impedance in circuit relationship with respect to said first termination impedance;
    determining the magnitude of current passing through said first termination impedance and through said additional impedance;
    determining the difference between the magnitudes of currents measured before and after said additional impedance is connected in circuit to establish a reference value; and monitoring said difference in the magnitudes of currents and said reference value to detect a change in said difference and said reference value whereby the condition of the antenna monitoring system can be maintained as desired and whereby changes in desired characteristics of said antenna element can be accurately determined.

11. A method as in claim 10 wherein said additional impedance is connected in shunt relationship with respect to said first termination impedance.

12. A method as in claim 10 whereas said first termination impedance and said additional impedance are resistors.

13. In an antenna monitoring system having at least one sampling element coupled to an antenna element, an antenna monitor having at least a first impedance and at least one electrical energy conductor connected between the sampling element and the impedance, the improvement comprising;
   at least one additional impedance located for selective placement in circuit relationship with said first impedance;
   circuit means in operative relationship with said additional impedance for selectively placing said additional impedance in circuit with said first impedance;
   first means in circuit relationship with said first impedance for measuring the electrical energy passing through said first impedance; and
   second means in operative relationship with said first impedance and with said additional impedance for measuring the electrical energy passing through said first impedance and through said additional impedance when said additional impedance is placed in circuit with said first impedance whereby changes in said monitoring system may be determined by comparing the electrical energy passing through said first and said additional impedance when the antenna element and the monitoring system are known to be operating properly with the electrical energy passing through said first and said additional impedance when the antenna element and the monitoring system are not known to be in proper operating condition.

14. A system as in claim 13 wherein said first impedance and said additional impedance are passive impedances.

15. A system as in claim 14 wherein said first measuring means comprises an ammeter connected in circuit between said first impedance and said sampling element.

16. A system as in claim 15 wherein said second measuring means also comprises said ammeter.

* * * * *

UNITED STATES PATENT AND TRADEMARK OFFICE
CERTIFICATE OF CORRECTION

PATENT NO. : 3,961,260
DATED : June 1, 1976
INVENTOR(S) : Francis S. Colligan

It is certified that error appears in the above-identified patent and that said Letters Patent are hereby corrected as shown below:

Claim 1, Line 20, the word "now" should read -- not --.

Signed and Sealed this

Ninth Day of November 1976

[SEAL]

Attest:

RUTH C. MASON
*Attesting Officer*

C. MARSHALL DANN
*Commissioner of Patents and Trademarks*